United States Patent
Goutzoulis et al.

(10) Patent No.: US 9,880,365 B2
(45) Date of Patent: Jan. 30, 2018

(54) FIBER-OPTIC FEEDTHROUGHS FOR SUPERCONDUCTING SYSTEMS

(71) Applicant: Microsoft Technology Licensing, LLC, Redmond, WA (US)

(72) Inventors: Anastasios P. Goutzoulis, Annapolis, MD (US); Leonard Chorosinski, Ellicott City, MD (US); Mario J. Venetos, BelAir, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/932,739

(22) Filed: Nov. 4, 2015

(65) Prior Publication Data

US 2017/0123171 A1 May 4, 2017

(51) Int. Cl.
*G02B 6/00* (2006.01)
*G02B 6/42* (2006.01)
(Continued)

(52) U.S. Cl.
CPC ........... *G02B 6/4248* (2013.01); *G02B 6/325* (2013.01); *G02B 6/3825* (2013.01);
(Continued)

(58) Field of Classification Search
USPC ................................................ 385/138, 147
See application file for complete search history.

(56) References Cited

U.S. PATENT DOCUMENTS 6,445,867 B1  9/2002  Gilliland et al.
6,648,520 B2  11/2003  McDonald et al.
(Continued)

FOREIGN PATENT DOCUMENTS

EP    1879060 A1    1/2008
EP    2101204 A1    9/2009
JP    S58147251 A   9/1983

OTHER PUBLICATIONS

Verghese, et al., "Fiber-Coupled Photomixers Operating At Cryogenic Temperatures", In Proceedings of Eighth International Symposium on Space Terahertz Technology, Mar. 1997, pp. 162-165.
Lu, et al., "Gigabit-per-Second Cryogenic Optical ILink Using Optimized Low-Temperature AlGaAs—GaAs Vertical-Cavity Surface-Emitting Lasers", In IEEE Journal of Quantum Electronics, vol. 32, Issue 8, Aug. 1996, pp. 1347-1359.
(Continued)

*Primary Examiner* — Eric Wong
(74) *Attorney, Agent, or Firm* — Ranjeev Singh; Singh Law, PLLC

(57) ABSTRACT

Interconnect systems for coupling a first system operating in a first type of environment (e.g., a cryogenic environment) to a second system operating in a second type of environment (e.g., a non-cryogenic environment) are provided. An interconnect system includes a first connector coupled to optical fibers that are coupled to the first system operating in the first type of environment. The interconnect system further includes a second connector coupled to optical fibers that are coupled to the second system operating in the second type of environment. The interconnect system may include an optical window configured to couple optical signals between the optical fibers, and the optical window is configured to maintain a vacuum seal between the first type of environment and the second type of environment such that the first type of environment is substantially thermally isolated from the second type of environment.

13 Claims, 10 Drawing Sheets

(51) Int. Cl.
*G02B 6/32* (2006.01)
*H03K 19/0948* (2006.01)
*H03K 19/195* (2006.01)
*G02B 6/38* (2006.01)

(52) U.S. Cl.
CPC ....... *G02B 6/3897* (2013.01); *H03K 19/0948* (2013.01); *H03K 19/195* (2013.01)

(56) References Cited

U.S. PATENT DOCUMENTS

| | | | |
|---|---|---|---|
| 8,027,094 B2 | 9/2011 | Day et al. | |
| 8,279,022 B2 * | 10/2012 | Thom | H01L 39/14 333/168 |
| 8,301,028 B2 | 10/2012 | Davidson et al. | |
| 8,423,103 B2 | 4/2013 | Hennessy et al. | |
| 8,464,542 B2 | 6/2013 | Hilton et al. | |
| 2010/0081303 A1 * | 4/2010 | Roth | G02B 6/3817 439/140 |
| 2012/0201268 A1 | 8/2012 | Boyd et al. | |
| 2014/0153875 A1 | 6/2014 | Bradley et al. | |

OTHER PUBLICATIONS

Haupt, et al., "Fiber-Connectorized Micropillar Cavities", In Applied Physics Letters, vol. 97, Issue 13, Sep. 27, 2010, 3 pages.
Xue, et al., "An Intra-Chip Free-Space Optical Interconnect", In Proceedings of the 37th Annual International Symposium on Computer Architecture, Jun. 19, 2010, pp. 94-105.
Johnston, et al., "Optical Links for Cryogenic Focal Plane Array Readout", In Optical Engineering, vol. 33, Issue 6, Jun. 1994, 7 pages.
Dolinar, et al., "On Approaching the Ultimate Limits of Photon-Efficient and Bandwidth-Efficient Optical Communication", In Proceedings of International Conference on Space Optical Systems and Applications, May 11, 2011, pp. 269-278.
Fujiwara, et al., "Coupling of Ultrathin Tapered Fibers with High-Q Microsphere Resonators at Cryogenic Temperatures and Observation of Phase-Shift Transition From Undercoupling to Overcoupling", In Journal of Optics Express, vol. 20, Issue 17, Aug. 13, 2012, 10 pages.
"International Search Report and Written Opinion Issued in PCT Application No. PCT/US2016/060011", dated Feb. 16, 2017, 13 Pages.

* cited by examiner

FIBER-OPTIC FEEDTHROUGHS FOR SUPERCONDUCTING SYSTEMS

BACKGROUND

Semiconductor based integrated circuits used in electronic devices, such as digital processors, include digital circuits based on complimentary metal-oxide semiconductor (CMOS) technology. CMOS technology, however, is reaching its scaling limits for transistor density. Additionally, increasing power consumption and heat dissipation of CMOS-based processors operating at high clock speeds limits their high-performance potential. As an example, servers in a data centers are increasingly consuming larger amounts of power as the data processing demands grow.

CMOS-based processors consumer power even when the CMOS circuits are quiescent, because they require power to maintain the state of the CMOS transistors in the CMOS circuits. Furthermore, because the CMOS circuits are powered using DC voltage, a certain amount of leakage current is always dissipated. Thus, even when such circuits are not processing information, some amount of power is always consumed not only as a result of the requirement to maintain the state of the CMOS transistors, but also as a result of the current leakage.

An alternative approach to the use of CMOS technology based processors, and related components, is the use of processors constructed from superconducting logic based devices. However, unlike CMOS based devices that can operate at room-temperature, superconducting logic based devices require lower cryogenic temperatures to function properly.

SUMMARY

In one example, the present disclosure relates to an interconnect system for coupling at least a first system operating in a first type of environment (e.g., a cryogenic environment) to at least a second system operating in a second type of environment (e.g., a non-cryogenic environment). The interconnect system may include at least a first connector coupled to at least a first set of optical fibers, where the at least the first set of the optical fibers is coupled to the at least the first system operating in the first type of environment. The interconnect system may further include at least a second connector coupled to at least a second set of optical fibers, where the at least the second set of the optical fibers is coupled to the at least the second system operating in the second type of environment. The interconnect system may further include: (1) at least a first port for coupling to the at least the first connector, and (2) at least a second port for coupling to the at least the second connector. The interconnect system may further include at least one interconnect, including at least a first distal end and at least a second distal end where the at least the first distal end of the at least one interconnect is coupled to the at least the first connector via the at least the first port, and where the at least the second distal end of the at least one interconnect is coupled to the at least the second connector via the at least the second port. The at least one interconnect may further be configured to carry signals between the at least the first set of the optical fibers and the at least the second set of the optical fibers, where the at least one interconnect is embedded in a vacuum chemical seal such that the first type of environment is substantially thermally isolated from the second type of environment.

In another aspect, an interconnect system for coupling at least a first system operating in a first type of environment (e.g., a cryogenic environment) to at least a second system operating in a second type of environment (e.g., a non-cryogenic environment) is provided. The interconnect system may include at least a first interface portion coupled to at least a first set of optical fibers, wherein the at least the first set of the optical fibers is coupled to the at least the first system operating in the first type of environment. The interconnect system may further include at least a second interface portion coupled to at least a second set of optical fibers, where the at least the second set of the optical fibers is coupled to the at least the second system operating in the second type of environment. The interconnect system may further include at least one feedthrough comprising: (1) at least one port for coupling the at least the first interface portion with the at least the second interface portion, and (2) at least one optical window, where the at least one optical window may include a plurality of lenses configured to couple optical signals between the at least the first set of the optical fibers and the at least the second set of the optical fibers, and where the at least one optical window may be configured to maintain a vacuum seal between the first type of environment and the second type of environment such that the first type of environment is substantially thermally isolated from the second type of environment.

In yet another aspect, an interconnect system for coupling at least a first system operating in a first type of environment (e.g., a cryogenic environment) to at least a second system operating in a second type of environment (e.g., a non-cryogenic environment) is provided. The interconnect system may include at least a first connector coupled to at least a first set of optical fibers, where the at least the first set of the optical fibers is coupled to the at least the first system operating in the first type of environment. The interconnect system may further include at least a second connector coupled to at least a second set of optical fibers, where the at least the second set of the optical fibers is coupled to the at least the second system operating in the second type of environment. The interconnect system may further include at least a first port for coupling to the at least the first connector, and at least a second port for coupling to the at least the second connector. The interconnect system may further include at least one optical window configured to couple optical signals between the at least the first set of the optical fibers and the at least the second set of the optical fibers, and where the at least one optical window may be configured to maintain a vacuum seal between the first type of environment and the second type of environment such that the first type of environment is substantially thermally isolated from the second type of environment.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
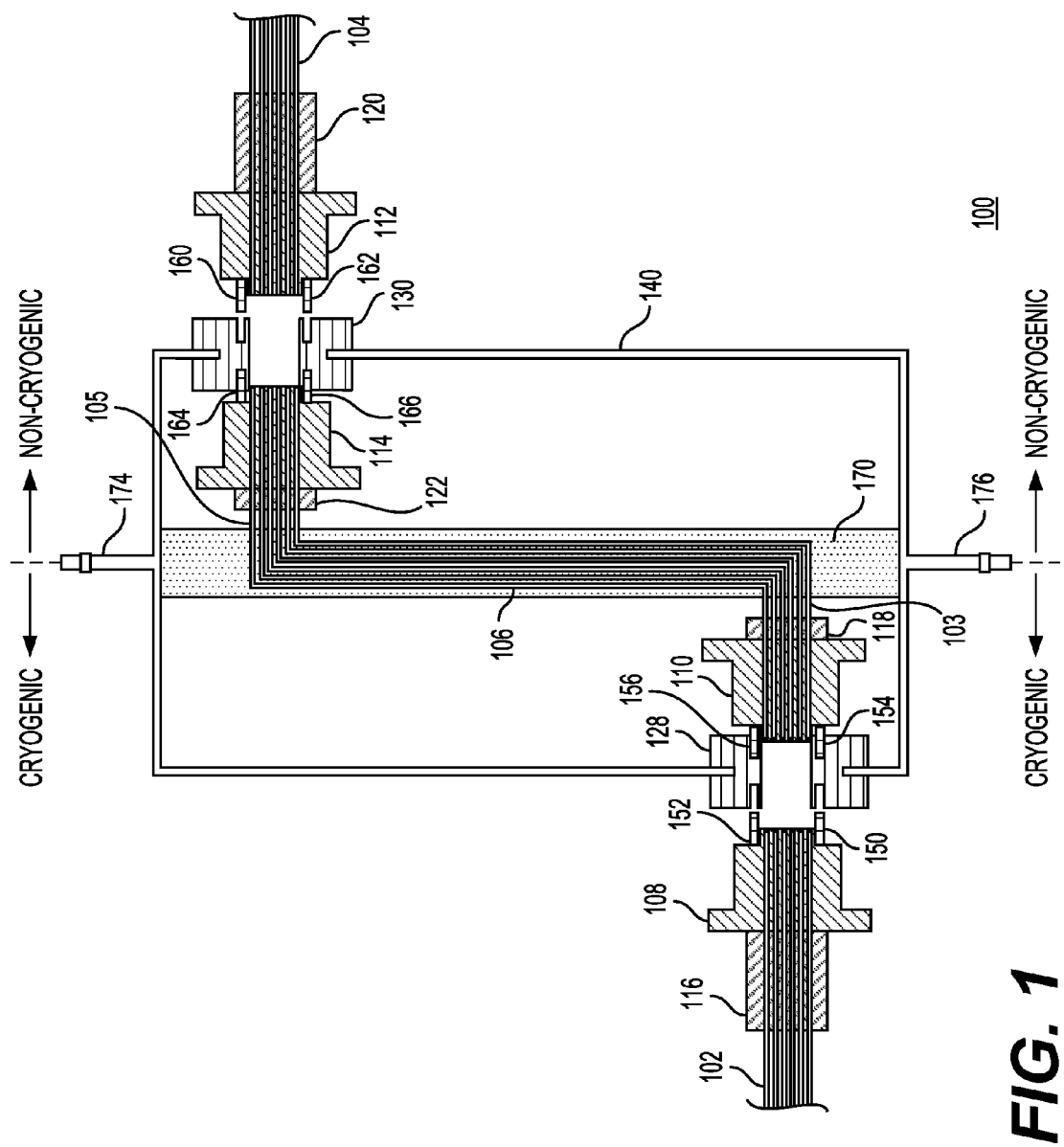
FIG. 1 shows a diagram of an interconnect system for coupling a system operating in a first type of environment

Examples described in this disclosure relate to interconnecting systems operating in a first type of environment (e.g., a cryogenic environment) with systems operating a second type of environment (e.g., a non-cryogenic environment), where the two environments may be different from each other in terms of temperature. In certain examples, the two systems are interconnected to each other via fiber-optic feedthroughs. Some examples relate to interconnecting systems based on superconducting logic compatible devices, which may process quantum information, e.g., qubits, with systems based on CMOS or other types of devices. Unlike CMOS transistors, the superconductor circuits use Josephson junction (JJ) based devices. Additionally, the JJ-based devices may use niobium interconnect metallization that dissipates very little to no power. These types of logic devices may advantageously be combined to create processors that dissipate very little to no power. However, unlike CMOS devices that can operate at room-temperature, superconducting JJ-based logic devices using, for example, niobium interconnect metallization may require cryogenic temperatures of around 4.2 Kelvin (K) to function properly. This is because pure niobium metal may not begin to superconduct until the temperature is lowered to 9.3 K. An additional temperature margin may be desirable to ensure that the superconductivity is stable even if some small amounts of impurities are introduced into the niobium in the circuit fabrication process. Although JJ-based devices are much more energy efficient than CMOS devices for creation of processors, more energy is required to cool them to cryogenic temperatures needed for their operation. The trade-off between creating processors using power inefficient CMOS devices operating at room temperature versus power efficient JJ-based devices operating at cryogenic temperatures comes down to the savings achieved for the respective total system power after accounting for respective power needs to provide the requisite cooling; that is, the total system power consumed for CMOS devices versus JJ-based logic devices.

An exemplary JJ may include two superconductors coupled via a region that impedes current. The region that impedes current may be a physical narrowing of the superconductor itself, a metal region, or a thin insulating barrier. As an example, the Superconductor-Insulator-Superconductor (SIS) type of JJs may be implemented as part of the superconducting circuits. As an example, superconductors are materials that can carry a direct electrical current (DC) in the absence of an electric field. Such materials have almost zero resistance. Exemplary superconductors, such as niobium has a critical temperature (Tc) of 9.3 Kelvin. At temperatures below Tc, niobium is superconductive; however, at temperatures above Tc, it behaves as a normal metal with electrical resistance. Thus, in the SIS type of Josephson junctions, superconductors may be niobium superconductors and insulators may be $Al_2O_3$ barriers. In SIS type of junctions, when a wave function tunnels through the barrier, a changing phase difference in time in the two superconductors creates a potential difference between the two superconductors. In superconducting circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In certain superconducting circuits, each Josephson junction may be part of one or more superconducting loops. The phase difference across the junction may be modulated by the magnetic flux applied to the loop.

Various superconducting circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The superconducting circuits may advantageously have zero static power dissipation because of the absence of bias resistors. In addition, the superconducting circuits may be powered using alternating current (AC) power thereby eliminating the ground return current. The AC power supply may also act as a stable clock reference signal for the superconducting circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary superconducting circuits may include various types of logic gates. Exemplary logic gates, include an AND gate, an OR gate, a logical A-and-not-B (AanB) gate and a logical AND/OR gate. The AanB gate may have two inputs and one output (Q). An input pulse A may propagate to output Q when favorable clock conditions may be present on an output Josephson transmission line (JTL), unless an input pulse B comes first with respect to either input pulse A or the favorable clock conditions on the output JTL. In some instances, if the input pulse B arrives after the input pulse A, but before the favorable clock conditions at the output JTL, the input pulse A may appear to propagate through the AanB gate; but may be suppressed before favorable clock conditions allow it to propagate. The AND/OR gate may have two inputs and two outputs (Q1 and Q2). The first input pulse, input pulse A or input pulse B goes to output Q1 and the second input pulse goes to output Q2. The logical behavior of these gates is based on the reciprocal data encoding mentioned earlier. As an example, a positive pulse changes the internal flux state of the inductive loop, but the trailing negative pulse erases the internal state every clock cycle, which in turn produces combinational logic behavior.

In general, microwave signals (e.g., SFQ pulses) may be used to control the state of superconducting quantum bits (qubits). Many implementations of the gates, such as superconducting logic gates, for superconducting quantum bits (qubits) require high-frequency microwave signals. When such superconducting logic based systems are connected to other types of logic based systems, such as systems based on CMOS devices, they need to be interconnected via high-speed communication links. In one example, such communication links may be fiber-optical, copper, or another type of communication link. In one example, such communication links may need to operate at 10-100 Gigabits per second (Gbits/s). In one example, a system operating in a cryogenic environment may require vacuum to operate properly. In one example, vacuum may relate to a pressure in a range of $10^{-8}$ Torr to $10^{-10}$ Torr.

In accordance with one example, FIG. 1 shows a diagram of an interconnect system 100 for interconnecting a system operating in a first type of environment with a system operating in a second type of environment. As an example, the first type of environment may be a cryogenic environment and the second type of environment may be a non-cryogenic environment. The system operating in the cryogenic environment (not shown) may be a system based on superconducting logic based devices that may operate in an environment at a temperature range of 4 K to 77 K. Any combination of low power lasers (e.g., vertical cavity surface emitting lasers (VCSELs)), low power modulators (e.g., integrated optical modulators (IOMs)), or detectors may be connected via interconnect system 100. In one example, this may require the maintenance of vacuum as part of the cryogenic environment. The system operating in the non-cryogenic environment (not shown) may be a system based on at least CMOS logic based devices that may operate at an ambient room temperature or even at a higher temperature or a lower temperature. In one example, the temperature range may be between 200 K to 400 K. In one example, the non-cryogenic environment may not require a vacuum. As discussed earlier, the two systems may be interconnected to provide a computing environment, such as the computing environment in a data-center for providing among other services, cloud-based services, such as software as a service or platform as a service. Optical fibers 102 may be coupled to the system operating in the cryogenic environment and optical fibers 104 may be coupled to the system operating in the non-cryogenic environment. Interconnect system 100 may include an interconnect 106, for example, a short fiber ribbon with a first distal end 103 and a second distal end 105. Optical fibers 102 may be coupled, via a connector boot 116, to a connector 108. Optical fibers 104 may be coupled, via a connector boot 120 to a connector 112. Optical fibers 102 and optical fibers 104 may be any combination of a number of single-mode fibers (SMF) or a number of multi-mode fibers (MMF). Connector 108 may be coupled to a port 128 (e.g., a bulkhead adapter) and connector 112 may be coupled to a port 130 (e.g., a bulkhead adapter). In another example, interconnect 106 may include several bundles of fiber ribbons. In such a case, assuming a twelve fiber-optic channel connector with a pitch of 250 microns, the twelve channels may only occupy about 3 mm width. By using twelve such fiber ribbons in a bundle (e.g., arranged one top of the other), 12×12=144 channels may be accommodated in a space of 9 mm². Alternatively, by using 24 such fiber ribbons in a bundle of 24×24=576 channels may be accommodated in a space of 36 mm².

With continued reference to FIG. 1, in one example, port 128 and port 130 may, respectively, be formed to provide access to an enclosure 140. Enclosure 140 may be formed using metal walls and may have flanges 174 and 176, as shown in FIG. 1. In one example, enclosure 140 may include a channel 170 filled with a vacuum chemical seal material. In one example, the vacuum chemical seal material may include appropriate amounts of at least magnesium silicate hydrate and epoxy resin. In another example, the vacuum chemical seal material may include appropriate amounts of at least dichloromethane, trichloroethylene, xylene, and benzene. In one example, the vacuum chemical seal material may include appropriate amounts of one or both of the "Torr Seal" product or the "Vac Seal" product from Accu-Glass Products, Inc. Interconnect 106 may be embedded in the vacuum chemical seal material in channel 170. Channel 170 may be filled with the vacuum chemical seal material such that the vacuum maintained on the cryogenic environment side is not compromised because of the coupling between the cryogenic environment side and the non-cryogenic environment side. The use of a vacuum chemical seal may advantageously obviate the need for sealing the optical fibers, the connectors for coupling the optical fibers to respective ports, or the ports themselves. In one example, channel 170 may be replaced with a tube welded to an enclosure. Similar to channel 170, the tube may also be filled with the vacuum chemical seal material and thereby provide similar functionality as channel 170. One distal end 103 of interconnect 106 may be coupled to port 128. The other distal end 105 of interconnect 106 may be coupled to port 130. In one example, distal end 103 may be coupled, via a connector boot 118, to a connector 110 and distal end 105 may be coupled, via a connector boot 122 to a connector 114. In one example, on the cryogenic environment side, connector 108 may further include alignment pins 150 and 152. Connector 110 may also further include alignment pins 154 and 156. In one example, port 128 may include alignment holes to receive the respective alignment pins 150, 152, 154, and 156, as shown in FIG. 1. Similarly, on the non-cryogenic environment side, in one example, connector 112 may further include alignment pins 160 and 162. Connector 110 may also further include alignment pins 164 and 166. In one example, port 130 may include alignment holes to receive the respective alignment pins 160, 162, 164, and 166, as shown in FIG. 1. In one example, the various components shown in FIG. 1, including connectors 108 and 110 and ports 128 and 130 may be formed using a suitable plastic material. Suitable plastic materials may be soft materials, such as they do not chip fiber ends, and may have a low thermal conductivity, such that they do not transfer thermal energy from the non-cryogenic environment to the cryogenic environment. As an example, Delrin®, an acetal homo-polymer resin, which is a type of plastic material, may be used.

Although FIG. 1 shows a certain number of components of interconnect system 100 arranged in a certain manner, there could be more or fewer number of components arranged differently. As an example, although FIG. 1 shows alignment pins associated with the connectors and the alignment holes associated with the ports, these could be reversed, such that the alignment pins may be associated with the respective ports and the alignment holes may be associated with the respective connectors. In addition, other types of couplings may be used to align the connectors with the ports.

Figure 2:
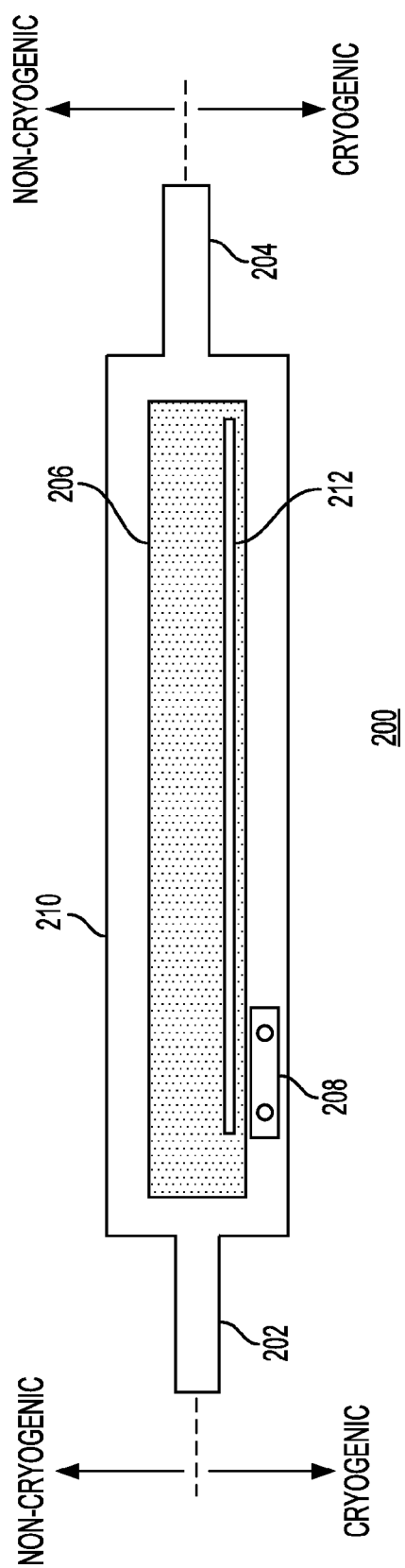
FIG. 2 shows a view of a portion of an interconnect system (e.g., as shown in FIG. 1) in accordance with one example.

FIG. 2 shows a diagram of a portion 200 of an interconnect system in accordance with one example. This example shows an alternative way of providing a vacuum chemical seal. As an example, although FIG. 1 shows a channel 170 filled with the vacuum chemical seal material, the entirety of enclosure 140 instead may be filled with the vacuum chemical seal and thereby obviating the need for channel 170. Portion 200 shows flanges 202 and 204 coupled to an enclosure 210. In this example, an inside chamber 206 of enclosure 210 (e.g., similar to enclosure 140 of FIG. 1) may be entirely filled with the vacuum chemical seal material such that the vacuum maintained on the cryogenic environment side is not compromised because of the coupling between the cryogenic environment side and the non-cryogenic environment side. An interconnect 212 (e.g., similar to interconnect 106 of FIG. 1) may be embedded in the vacuum chemical seal material. Portion 200 of an interconnect system (e.g., as shown in FIG. 1) also shows a view of a connector 208 for coupling optical fibers to the system operating on the cryogenic environment side. Although FIG. 2 shows a certain number of components of an interconnect system arranged in a certain manner, there could be more or fewer number of components arranged differently.

Figure 3:
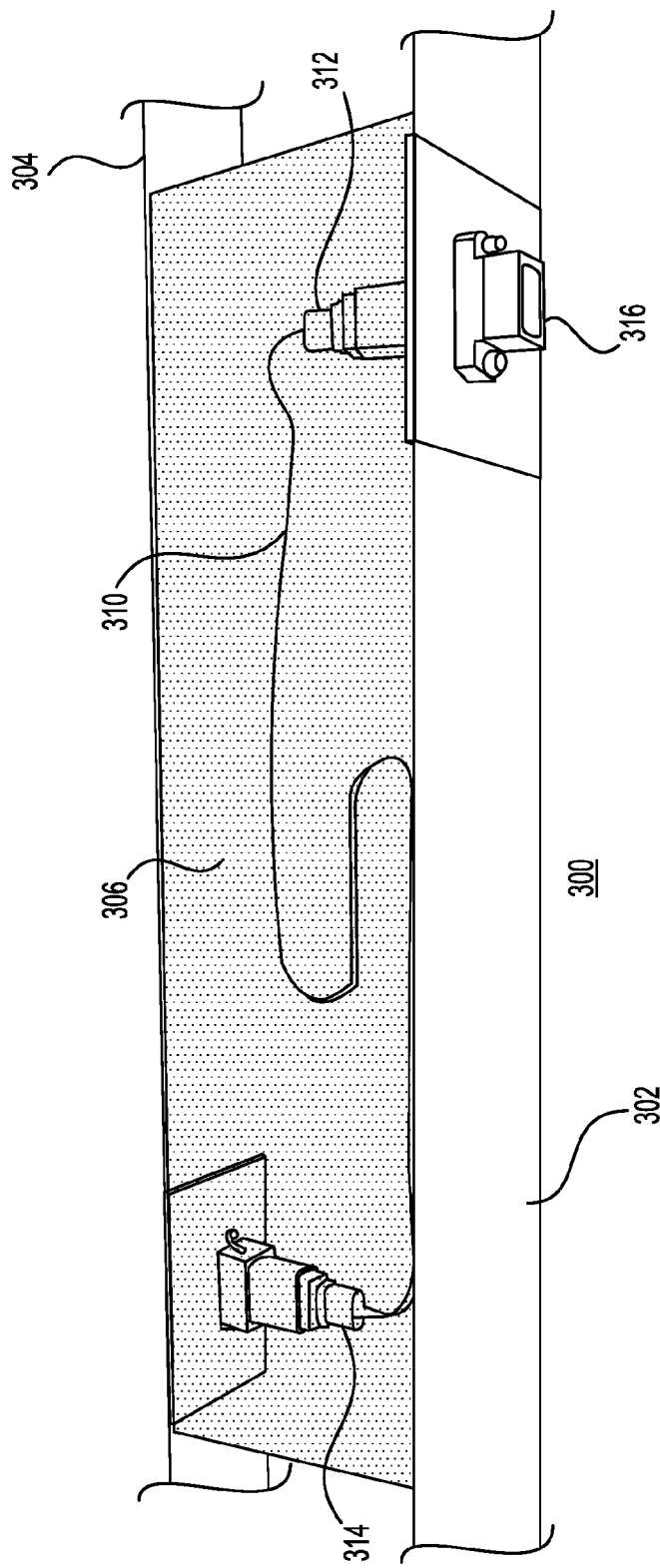
FIG. 3 shows another view of a portion of an interconnect system (e.g., as shown in FIG. 1) in accordance with one example.
Figure 4:
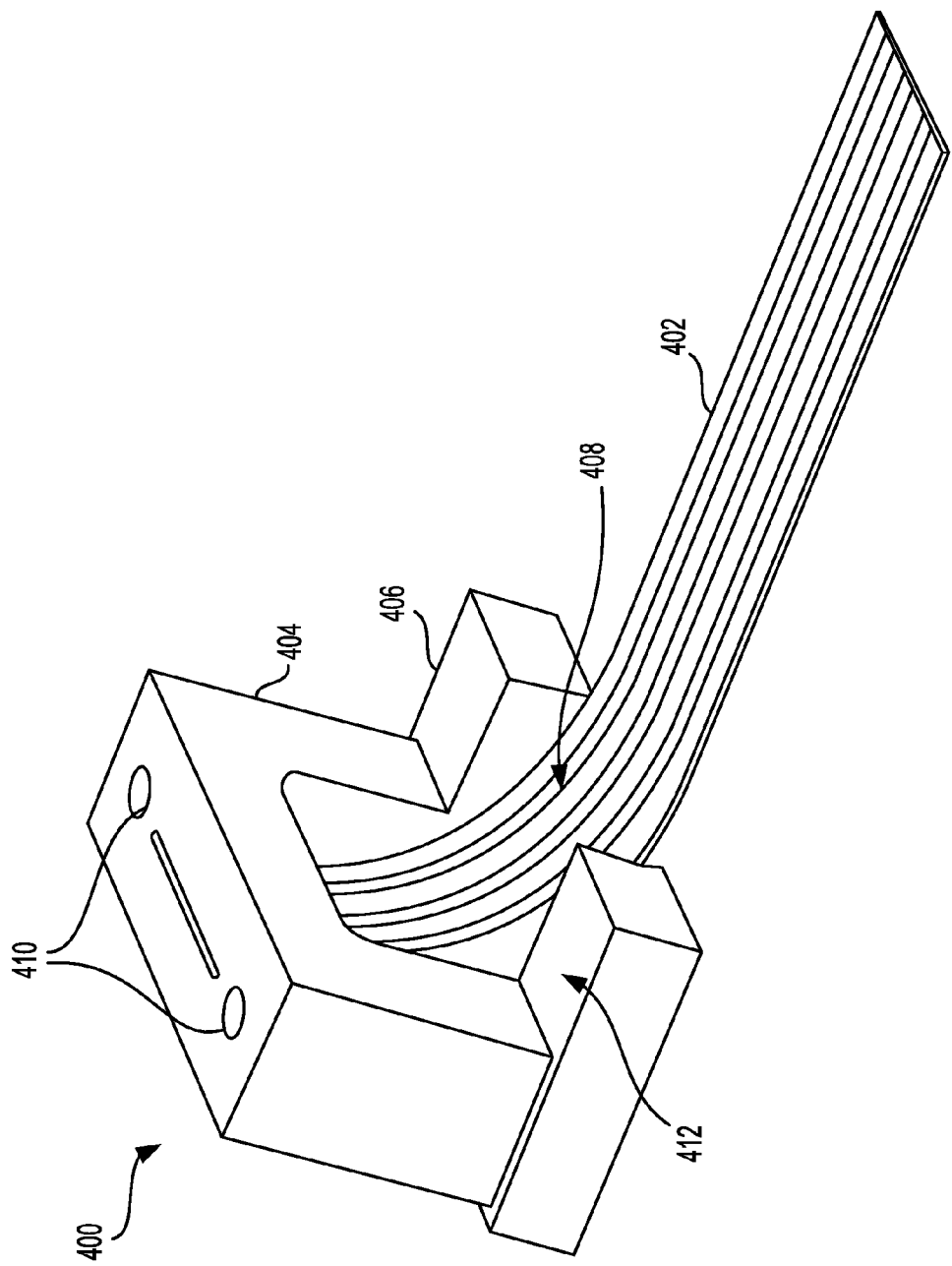
FIG. 4 shows a diagram of a connector and its coupling to an interconnect in accordance with one example.

FIG. 3 shows another view of a portion 300 of an interconnect system (e.g., as shown in FIG. 1) in accordance with one example. This example shows the use of commercial over the shelf (COTS) connectors as part of the interconnect system. The use of COTS connectors may advantageously lower the cost of interconnecting systems operating in a cryogenic environment with systems operating in a non-cryogenic environment. In this example, the inside of an enclosure 306 (e.g., similar to enclosure 140 of FIG. 1) may be entirely filled with the vacuum chemical seal material such that the vacuum maintained on the cryogenic environment side is not compromised because of the coupling between the cryogenic environment side and the non-cryogenic environment side. An interconnect 310 (e.g., similar to interconnect 106 of FIG. 1) may be embedded in the vacuum chemical seal material. Portion 300 of an interconnect system (e.g., as shown in FIG. 1) also shows COTS connectors 312 and 314 for coupling interconnect 310 to the optical fibers for both the system operating on the cryogenic environment side and the system operating on the non-cryogenic side. Portion 300 further shows wall portions 302 and 304 of a wall that may include enclosure 306 that may contain the vacuum chemical seal material. Another COTS connector 316 may be used to connect to the optical fibers carrying signals from the system on the non-cryogenic environment side. A similar COTS connector (not shown) may be used on the other side of portion 300 to connect to the optical fibers carrying signals from a system on the cryogenic environment side. Although FIG. 3 shows a certain number of components of an interconnect system arranged in a certain manner, there could be more or fewer number of components arranged differently. As an example, although FIG. 3 shows alignment pins associated with the connectors and the alignment holes associated with the ports, these could be reversed, such that the alignment pins may be associated with the respective ports and the alignment holes may be associated with the respective connectors FIG. 4 shows a diagram of a connector 400 and its coupling to an interconnect in accordance with one example. In this example, connector 400 may be coupled to an interconnect 402 (e.g., a fiber ribbon) at a 90 degree angle 412. The coupling of connector 400 to interconnect 402 may advantageously allow a thinner enclosure or a thinner channel containing the vacuum chemical seal. In one example, the two sides of such an enclosure or a channel may be separated by less than 1 cm. Connector 400 may include a connector portion 404 that may be coupled to another connector portion 406 at a right angle 412. Interconnect 402 may be a fiber ribbon with multiple optical fibers. Interconnect 402 may be bent at a radius that allows the propagation of the optical signals. For example, the radius of the bend 408 may be 5 mm. As discussed earlier, connector 400 may include alignment pins or alignment holes to properly align the connector to a port in the enclosure housing the interconnect. Although FIG. 4 shows a certain number of components of component 400 and its coupling to an interconnect 402 arranged in a certain manner, there could be more or fewer number of components arranged differently.

Figure 5:
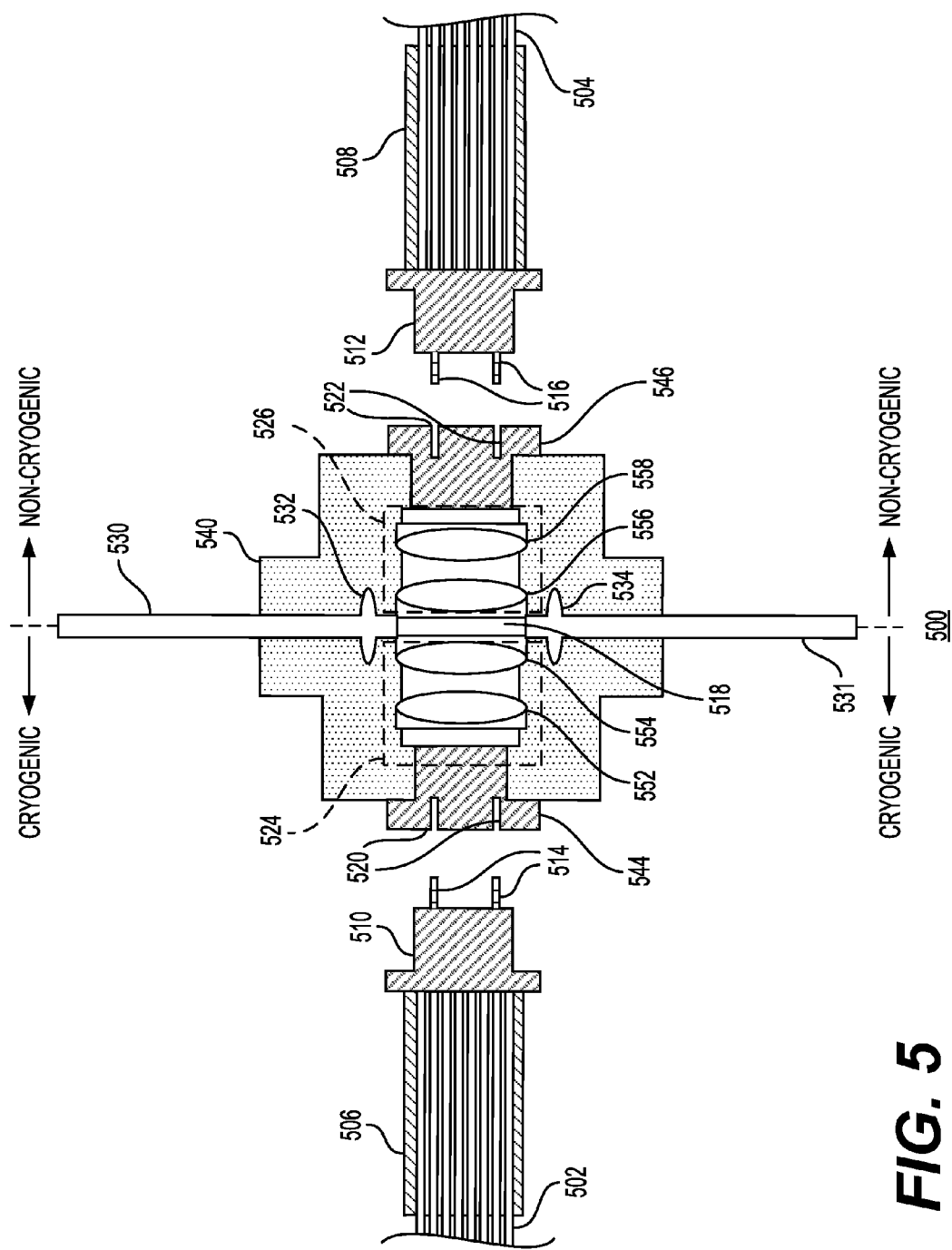
FIG. 5 shows a diagram of an interconnect system for coupling a system operating in a first type of environment (e.g., a cryogenic environment) with a system operating in a second type of environment (e.g., a non-cryogenic environment) in accordance with one example.

In accordance with another example, FIG. 5 shows a diagram of an interconnect system 500 for interconnecting a system operating in a first type of environment with a system operating in a second type of environment. As an example, the first type of environment may be a cryogenic environment and the second type of environment may be a non-cryogenic environment. The system operating in a cryogenic environment (not shown) may be a system based on superconducting logic based devices that may operate in an environment at a temperature range of 4 K to 77 K. In one example, this may require the maintenance of vacuum as part of the cryogenic environment. The system operating in the non-cryogenic environment (not shown) may be a system based on at least CMOS logic based devices that may operate at an ambient room temperature or even at a higher temperature or a lower temperature. In one example, the temperature range may be between 200 K to 400 K. In one example, the non-cryogenic environment may not require a vacuum. As discussed earlier, the two systems may be interconnected to provide a computing environment, such as the computing environment in a data-center for providing among other services, cloud-based services, such as software as a service or platform as a service. Optical fibers 502 may be coupled to the system operating in the cryogenic environment and optical fibers 504 may be coupled to the system operating in the non-cryogenic environment. Optical fibers 502 may be coupled, via a connector boot 506, to a connector 510. Optical fibers 504 may be coupled, via a connector boot 508 to a connector 512. Connector 510 and connector 512 may be coupled to each other through feedthrough 540 such that the optical signals may be exchanged between the system operating in the cryogenic environment and the system operating in the non-cryogenic environment. Feedthrough 540 may include a port 544, another port 546, and an optical window 518. Connector 510 may be coupled to port 544 (e.g., a bulkhead adapter) and connector 512 may be coupled to port 546 (e.g., a bulkhead adapter). In one example, some of the components shown in FIG. 5, including connectors 510 and 512, connector boots 506 and 508, and ports 544 and 546 may be formed using a suitable plastic material. Suitable plastic materials may be soft materials, such as they do not chip fiber ends, and may have a low thermal conductivity, such that they do not transfer thermal energy from the non-cryogenic environment to the cryogenic environment. As an example, Delrin®, an acetal homo-polymer resin, which is a type of plastic material, may be used. In one example, on the cryogenic environment side, connector 510 may further include alignment pins 514. In one example, port 544 may include alignment holes to 520 to receive the respective alignment pins 514 as shown in FIG. 5. Similarly, on the non-cryogenic environment side, in one example, connector 512 may further include alignment pins 516. In one example, port 546 may include alignment holes to receive the respective alignment pins 516, as shown in FIG. 5. Although FIG. 5 shows alignment pins associated with the connectors and the alignment holes associated with the ports, these could be reversed, such that the alignment pins may be associated with the respective ports and the alignment holes may be associated with the respective connectors.

With continued reference to FIG. 5, interconnect system 500 may include at least one wall (including wall portion 530 and wall portion 531) between the cryogenic environment and the non-cryogenic environment. Wall portion 530 may further include an alignment structure 532 for aligning wall portion 530 with feedthrough 540. Similarly, wall portion 531 may include an alignment structure for aligning wall portion 531 with feedthrough 540. Optical window 518 may be configured to ensure that substantial thermal isolation is maintained between the cryogenic environment and the non-cryogenic environment. Optical window 518 may further be configured to ensure that optical propagation between the cryogenic environment and the non-cryogenic environment sides experiences minimum optical loss. Any combination of low power lasers (e.g., vertical cavity surface emitting lasers (VCSELs)), low power modulators (e.g., integrated optical modulators (IOMs)), or detectors may be connected via interconnect system 500. Feedthrough 540 may further include an optical system including an optical sub-system 524 and another optical sub-system 526. Optical sub-system 524 may be arranged on one side of optical window 518 and optical sub-system 526 may be arranged on the other side of optical window 518. One of the sides may be opposite to the other side. Optical system, including the two sub-systems may be configured to couple optical signals between optical fibers 502 and optical fibers 504. Each of the optical system and optical window 518 may be configured to maintain a vacuum seal between the cryogenic environment and the non-cryogenic environment such that the cryogenic environment is substantially thermally isolated from the non-cryogenic environment. Each of optical sub-system 524 and optical sub-system 526 may include several lenses. As an example, optical sub-system 524 may include a lens 552 and another lens 554, which may be arranged as shown in FIG. 5. As an example, optical sub-system 526 may include a lens 556 and another lens 558, which may be arranged as shown in FIG. 5. Each of the combinations of lenses may be configured to focus light rays received from optical fibers 502 and 504, respectively, in a way that after they pass through the lenses, the light rays are focused on respective optical fibers. This may permit bi-directional transfer of signals between the system operating in the cryogenic environment and the system operating in the non-cryogenic environment. In another example, each of the set of optical fibers may include several bundles of fiber ribbons. In such a case, assuming a twelve fiber-optic channel connector with a pitch of 250 microns, the twelve channels may only occupy about 3 mm width. By using twelve such fiber ribbons in a bundle (e.g., arranged one on top of the other), 12×12=144 channels may be accommodated in a space of 9 mm². Alternatively, by using 24 such fiber ribbons in a bundle of 24×24=576 channels may be accommodated in a space of 36 mm².

Although FIG. 5 shows a certain number of components of interconnect system 500 arranged in a certain manner, there could be more or fewer number of components arranged differently. As an example, although FIG. 5 shows alignment pins associated with the connectors and the alignment holes associated with the ports, these could be reversed, such that the alignment pins may be associated with the respective ports and the alignment holes may be associated with the respective connectors. In addition, other types of couplings may be used to align the connectors with the ports.

Figure 6:
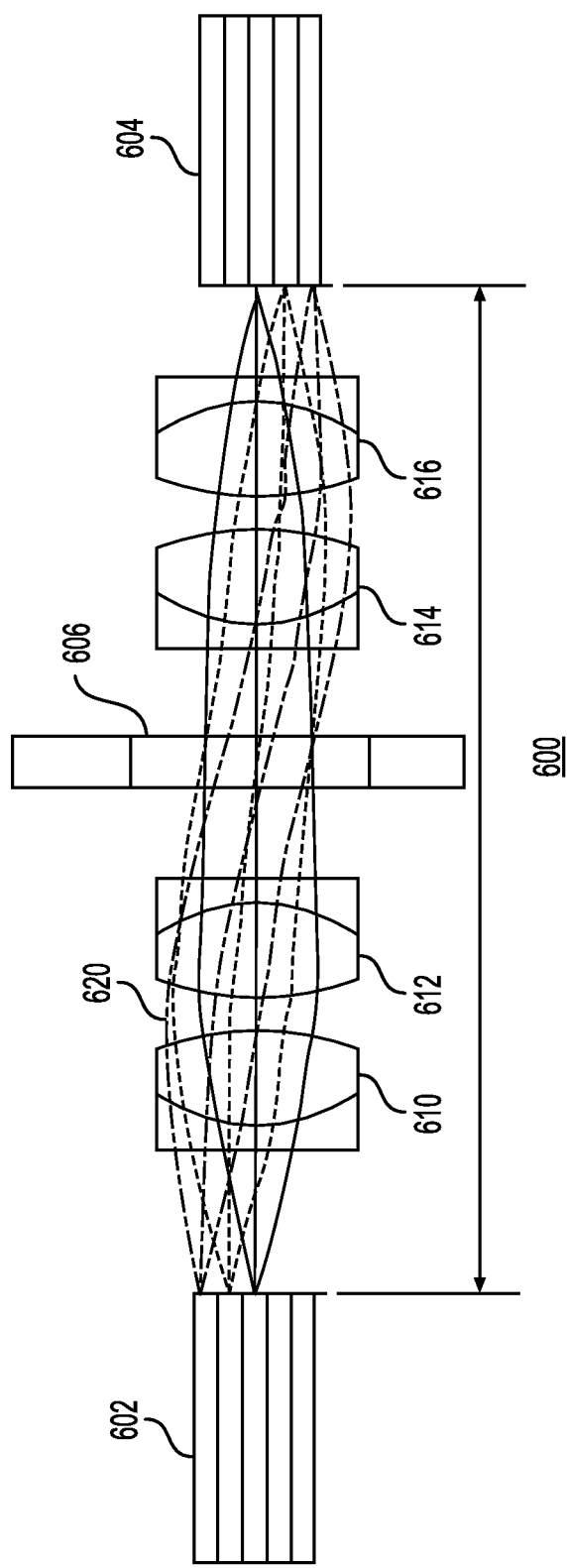
FIG. 6 shows a diagram of the processing of light rays as part of an optical system in accordance with one example.

FIG. 6 shows a diagram 600 of the processing of light rays as part of an optical system in accordance with one example. As discussed earlier, interconnect system 500 (FIG. 5) may include an optical sub-system (e.g., 524 of FIG. 5) and another optical sub-system (e.g., 526 of FIG. 6). One optical sub—may be arranged on one side of an optical window (e.g., 518 of FIG. 5) and the other optical sub-system (e.g., 526 of FIG. 5) may be arranged on the other side of the optical window. One of the sides may be opposite to the other side. Optical system, including the two sub-systems may be configured to couple optical signals between optical fibers 602 and optical fibers 604. As discussed earlier, each of the two optical sub-systems may include several lenses that may be arranged on each side of optical window 606. As an example, one optical sub-system may include lenses 610 and 612 and the other optical sub-system may include lenses 614 and 616. Each of the combinations of lenses may be configured to focus light rays received from optical fibers 602 and 604, respectively, in a way that after they pass through the lenses, light rays 620 are focused on the tips of respective optical fibers. This may permit bi-directional transfer of signals between the system operating in the cryogenic environment and the system operating in the non-cryogenic environment. In one example, although not shown, the tips of optical fibers may be lensed. Although FIG. 6 shows a certain number of components arranged in a certain manner, there could be more or fewer number of components arranged differently.

Figure 7:
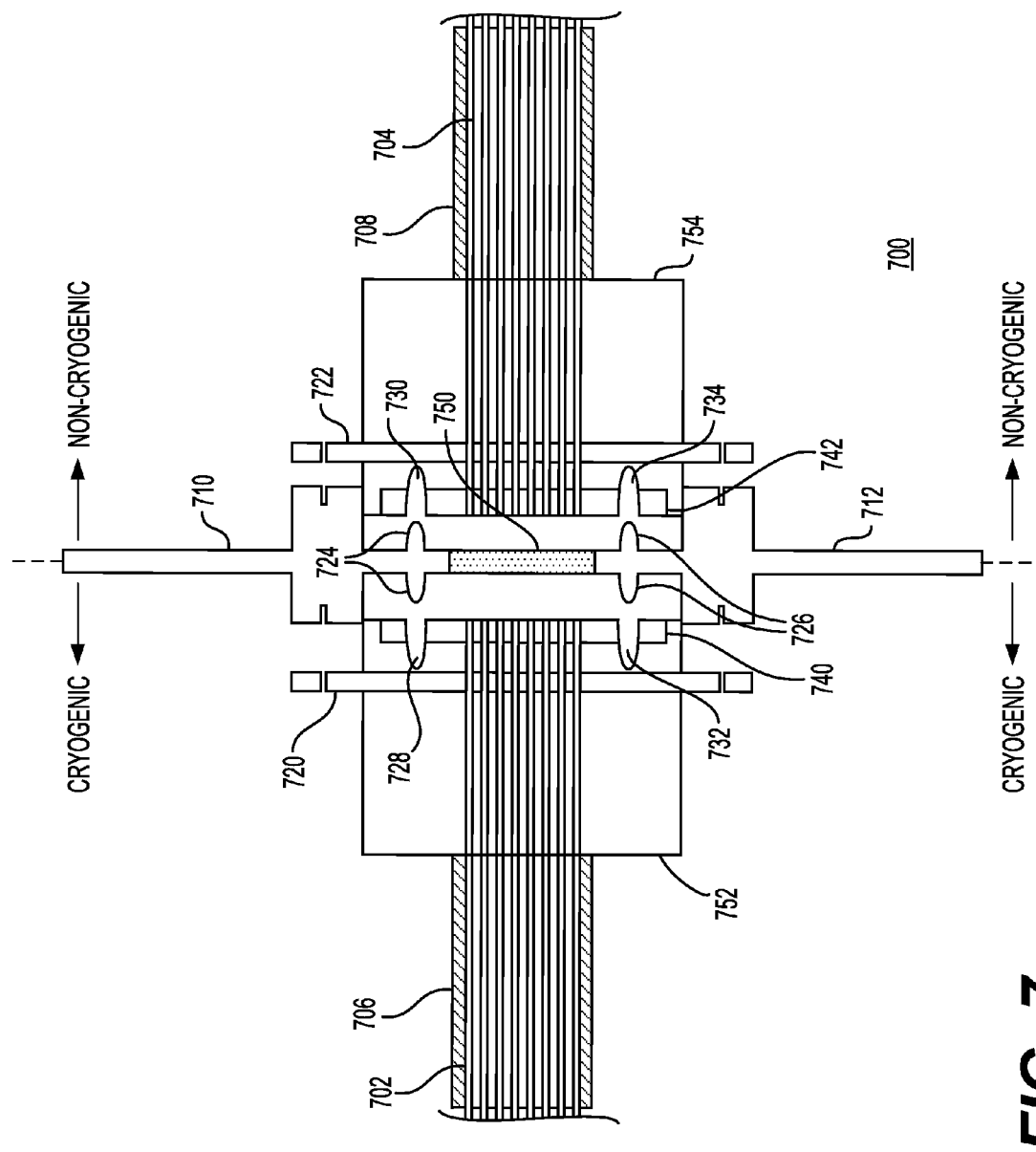
FIG. 7 shows a diagram of an interconnect system for coupling a system operating in a first type of environment (e.g., a cryogenic environment) with a system operating in a second type of environment (e.g., a non-cryogenic environment) in accordance with one example.

In accordance with another example, FIG. 7 shows a diagram of an interconnect system 700 for coupling a system operating in a cryogenic environment with a system operating in a non-cryogenic environment. The system operating in a cryogenic environment (not shown) may be a system based on superconducting logic based devices that may operate in an environment at a temperature range of 4 K to 77 K. In one example, this may require the maintenance of vacuum as part of the cryogenic environment. The system operating in the non-cryogenic environment (not shown) may be a system based on at least CMOS logic based devices that may operate at an ambient room temperature or even at a higher temperature or a lower temperature. In one example, the temperature range may be between 200 K to 400 K. In one example, the non-cryogenic environment may not require a vacuum. As discussed earlier, the two systems may be interconnected to provide a computing environment, such as the computing environment in a data-center for providing among other services, cloud-based services, such as software as a service or platform as a service. Optical fibers 702 may be coupled to the system operating in the cryogenic environment and optical fibers 704 may be coupled to the system operating in the non-cryogenic environment. Any combination of low power lasers (e.g., vertical cavity surface emitting lasers (VCSELs)), low power modulators (e.g., integrated optical modulators (IOMs)), or detectors may be connected via interconnect system 700. Optical fibers 702 may be coupled, via an interface coupling 706, to an interface portion 752. Optical fibers 704 may be coupled, via an interface coupling 708 to an interface portion 754. Interface portion 752 may have a pre-drilled plate 740 arranged on the cryogenic environment side. Interface portion 754 may further have a pre-drilled plate 742 on arranged on the non-cryogenic environment side. In one example, some of the components shown in FIG. 7, including interface portions 752 and 754 may be formed using a suitable plastic material. Suitable plastic materials may be soft materials, such as they do not chip fiber ends, and may have a low thermal conductivity, such that they do not transfer thermal energy from the non-cryogenic environment to the cryogenic environment. As an example, Delrin®, an acetal homo-polymer resin, which is a type of plastic material, may be used. In one example, these components may be fabricated in a five-step process. First, pre-drilled plates 740 and 742 may be formed by drilling holes in plates (e.g., made of Delrin®) in a grid that corresponds to fibers corresponding to optical fibers to be coupled. The holes may have a diameter proportional to the size of the fiber cladding for the respective optical fibers. These holes may be formed using a laser or other equipment. Second, the ends of optical fibers (e.g., 702 and 704) may be stripped. Third, the ends or tips of the optical fibers may be etched (e.g., by wet chemical etching using hydrofluoric acid) to form lensed ends. Fourth, the etched fibers may be inserted into respective pre-drilled plates 740 and 742. Fifth, portions of the optical fibers may be bonded using a suitable material, such as epoxy appropriate for cryogenic environments.

With continued reference to FIG. 7, a wall, to separate the two sides, may include wall portions 710 and 712. Alignment pins 724 and 726, provided along the same axis as the wall, may be used to align the wall with the respective connector portions. To ensure a proper connection, flanges 720 and 722 may be used, as well. An optical window 750 may be provided along the same axis as the wall. Optical window 750 may advantageously provide free-space propagation of the signals received from the optical fibers on one side of the optical window to the other side. Optical window 750 may be configured to ensure that substantial thermal isolation is maintained between the cryogenic environment and the non-cryogenic environment. Optical window 518 may further be configured to ensure that optical propagation between the cryogenic environment and the non-cryogenic environment sides experiences minimum optical loss. Optical window 750 may be configured to couple optical signals between optical fibers 702 and optical fibers 704. Optical window 750 may be configured to maintain a vacuum seal between the cryogenic environment and the non-cryogenic environment such that the cryogenic environment is substantially thermally isolated from the non-cryogenic environment.

Although FIG. 7 shows a certain number of components of interconnect system 700 arranged in a certain manner, there could be more or fewer number of components arranged differently. As an example, although FIG. 7 shows alignment pins associated with the connector portions and the alignment holes associated with the wall, these could be reversed, such that the alignment pins may be associated with the wall and the alignment holes may be associated with the respective connector portions. In addition, other types of couplings may be used to align the connector portions with the wall. In addition, although FIG. 7 shows the interface portions as stationary parts, one of them may be a floating part. As an example, a stationary part may be attached, as an interface portion, to the frame of the wall via a flange. A floating part may be included in the interface portion on the optical fibers side. The floating part may include alignment holes allowing for more flexible mating of the alignment pins associated with the interface portion for the wall.

Figure 8:
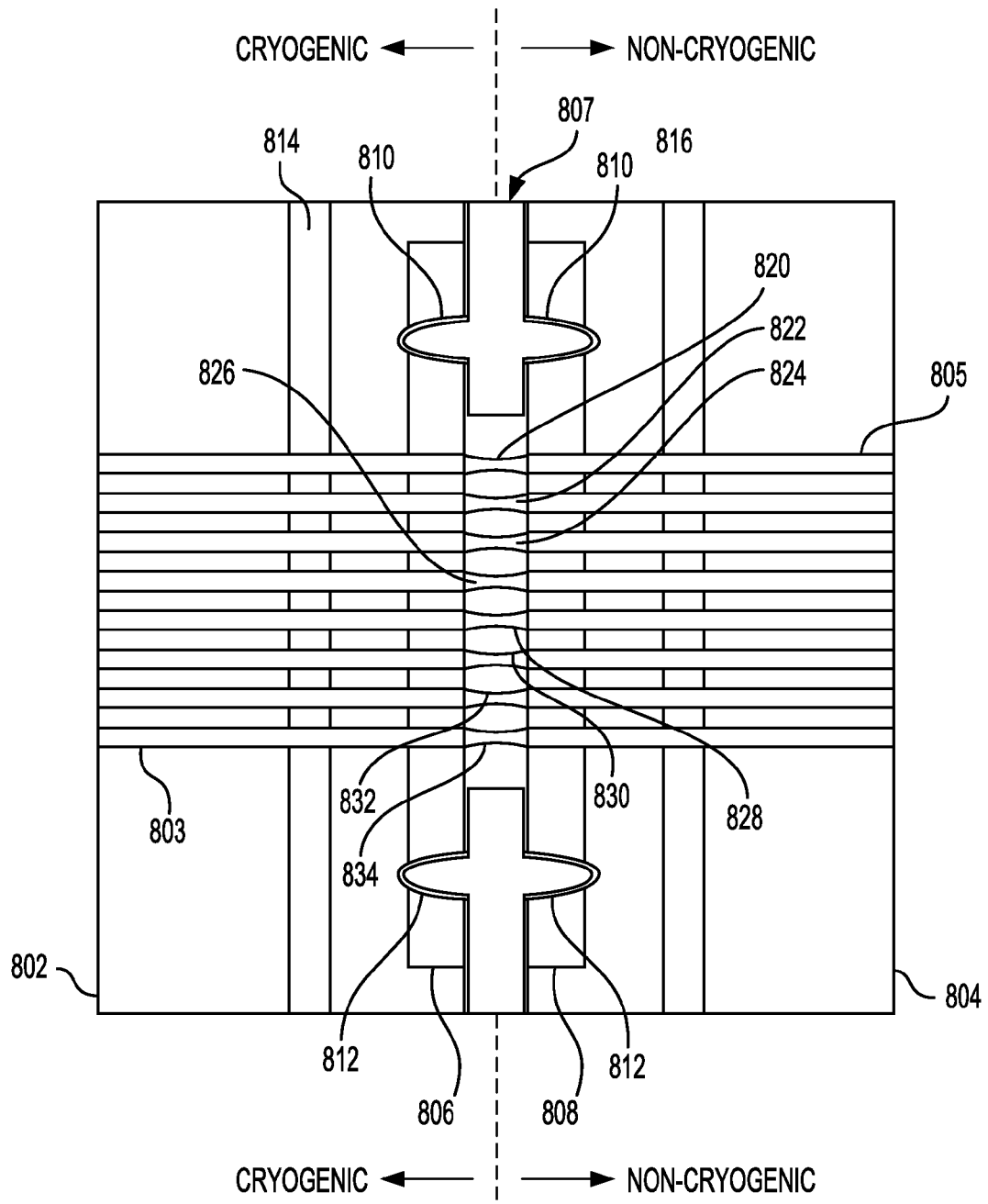
FIG. 8 shows a portion of interconnect system of FIG. 7 in accordance with one example.

FIG. 8 shows a portion of interconnect system 700 of FIG. 7 in accordance with one example. FIG. 8 provides additional details of interconnect system 700 by showing a cross-section view of ports 752 and 754 of FIG. 7 and related components in accordance with one example. As discussed earlier, optical fibers 803 may be coupled to the system operating in the cryogenic environment and optical fibers 805 may be coupled to the system operating in the non-cryogenic environment. Optical fibers 803 may be coupled to an interface portion 802. Optical fibers 805 may be coupled to an interface portion 804. The tips of optical fibers may be lensed (not shown), which may help focus the light rays on the opposite optical fibers. Interface portion 802 may have a pre-drilled plate 806 arranged on the cryogenic environment side. Interface portion 804 may further have a pre-drilled plate 808 on arranged on the non-cryogenic environment side. In addition, a wall 807, to separate the two sides, may include an optical window that may include optical fibers on each connected side via lenses. Alignment pins 810 and 812, provided along the same axis as the wall, may be used to align the wall with the respective connector portions. To ensure a proper connection, flanges 814 and 816 may be used, as well. The lensed fiber tips may focus the light rays 820, 822, 824, 826, 828, 830, 832, and 834 on opposite optical fibers. In this way, the optical window may advantageously provide free-space propagation of the signals received from the optical fibers on one side of the optical window to the other side. The optical window may be configured to maintain a vacuum seal between the cryogenic environment and the non-cryogenic environment such that the cryogenic environment is substantially thermally isolated from the non-cryogenic environment.

Although FIG. 8 shows a certain number of components of interconnect system 800 arranged in a certain manner, there could be more or fewer number of components arranged differently. As an example, although FIG. 8 shows alignment pins associated with the connector portions and the alignment holes associated with the wall, these could be reversed, such that the alignment pins may be associated with the wall and the alignment holes may be associated with the respective connector portions. In addition, other types of couplings may be used to align the connector portions with the wall.

Figure 9:
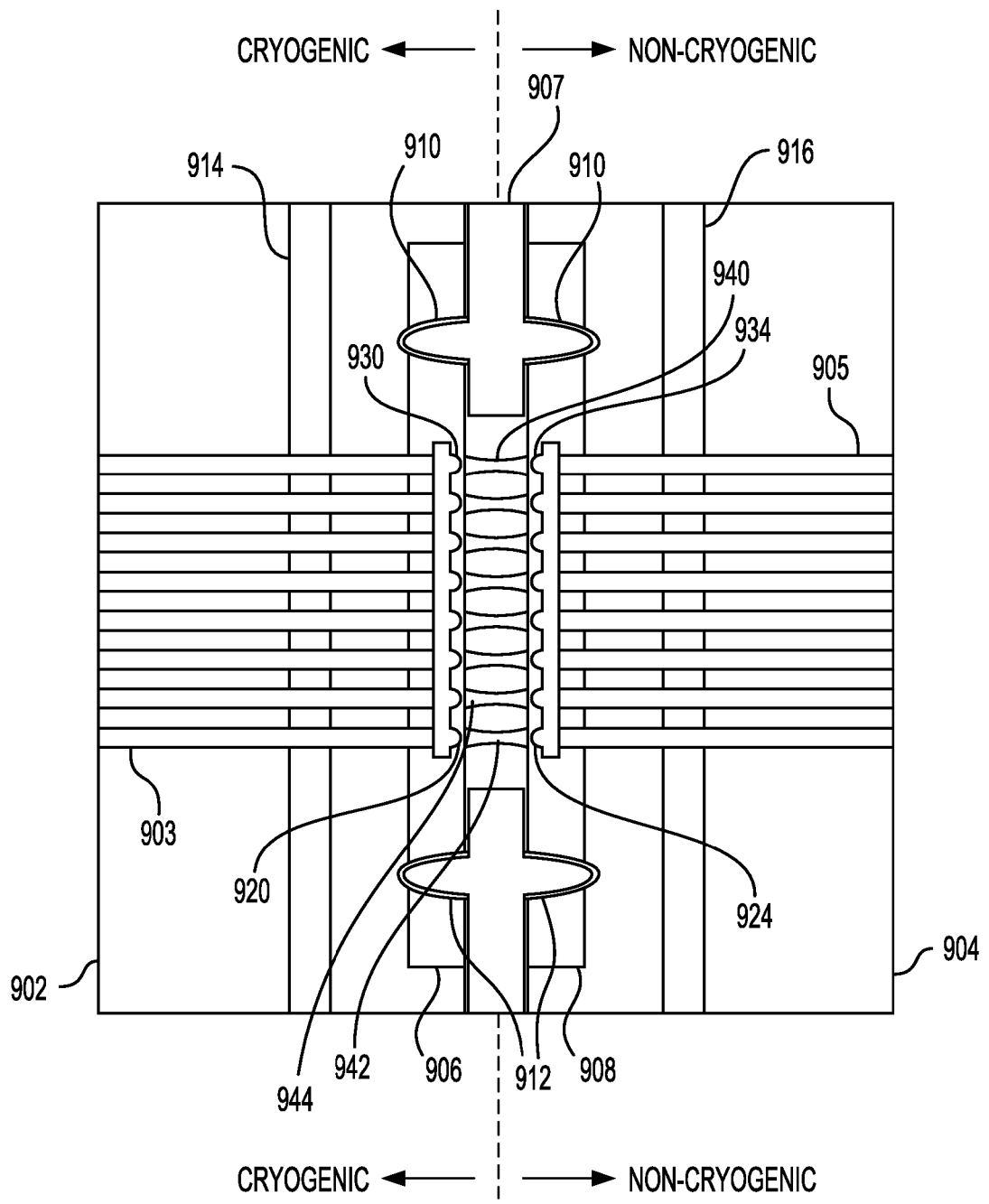
FIG. 9 shows a portion of interconnect system of FIG. 7 in accordance with another example.

FIG. 9 shows a portion of interconnect system 700 of FIG. 7 in accordance with another example. FIG. 9 provides additional details of interconnect system 700 by showing a cross-section view of ports 752 and 754 of FIG. 7 and related components in accordance with another example. As discussed earlier, optical fibers 903 may be coupled to the system operating in the cryogenic environment and optical fibers 905 may be coupled to the system operating in the non-cryogenic environment. Optical fibers 903 may be coupled to an interface portion 902. Optical fibers 905 may be coupled to an interface portion 904. The tips of optical fibers that are coupled to lenses (e.g., 920, 924, 930, and 934) which may help collimate the light rays. Interface portion 902 may have a pre-drilled plate 906 arranged on the cryogenic environment side. Interface portion 904 may further have a pre-drilled plate 908 on arranged on the non-cryogenic environment side. In addition, a wall 907, to separate the two sides, may include an optical window that may include optical fibers on each connected side via lenses. Alignment pins 910 and 912, provided along the same axis as the wall, may be used to align the wall with the respective connector portions. To ensure a proper connection, flanges 914 and 916 may be used, as well. A lens array may be configured to couple optical signals between optical fibers 903 and optical fibers 905. Lens array may focus lights rays 942 and 944. In this way, the optical window may advantageously provide free-space propagation of the signals received from the optical fibers on one side of the optical window to the other side. The optical window may be configured to maintain a vacuum seal between the cryogenic environment and the non-cryogenic environment such that the cryogenic environment is substantially thermally isolated from the non-cryogenic environment.

Although FIG. 9 shows a certain number of components of interconnect system 900 arranged in a certain manner, there could be more or fewer number of components arranged differently. As an example, although FIG. 9 shows alignment pins associated with the connector portions and the alignment holes associated with the wall, these could be reversed, such that the alignment pins may be associated with the wall and the alignment holes may be associated with the respective connector portions. In addition, other types of couplings may be used to align the connector portions with the wall.

Figure 10:
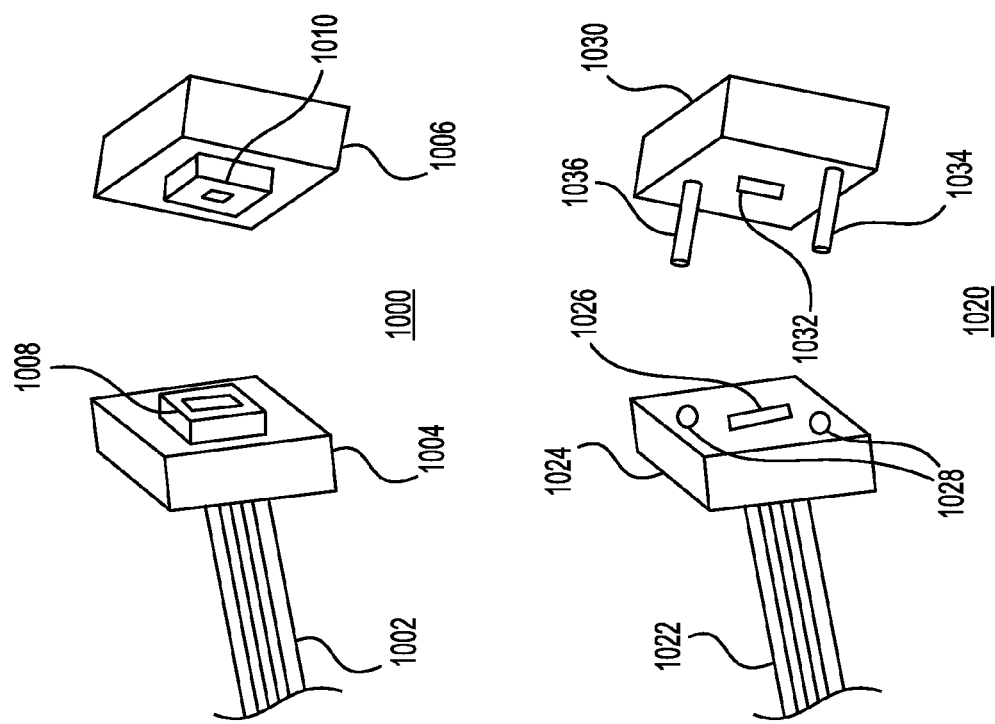
FIG. 10 shows diagrams of examples of two alignment options for aligning the interface portions with an optical window.

FIG. 10 shows diagrams of examples of two alignment options for aligning the interface portions with an optical window. The over-molded alignment option may include the use of over-molded connector portions. The pin alignment option may include the use alignment pins. As shown in FIG. 10, as part of over-molded alignment option 1000, an interface portion 1004 may be coupled with the optical window or the wall (e.g., portion 1006) using molded connectors 1008 and 1010. Thus, for example, optical fibers 1002 may be coupled to connector 1008. Alternatively, as shown in FIG. 10, as part of pin alignment option 1020, an interface portion 1024 may be coupled with the optical window or the wall (e.g., 1030) using connectors 1026 and 1032. Alignment pins 1034 and 1036 may be received by alignment holes 1024 and 1024 to properly align interface portion 1024 with the optical window or the wall (e.g., portion 1020). As discussed earlier, with respect to FIG. 7, FIG. 8, and FIG. 9, the optical window may advantageously provide free-space propagation of the signals received from the optical fibers on one side of the optical window to the other side. Although FIG. 10 shows a certain number of components of the alignment options arranged in a certain manner, there could be more or fewer number of components arranged differently. As an example, although FIG. 10 shows alignment pins associated with the connector portions and the alignment holes associated with the wall/optical window, these could be reversed, such that the alignment pins may be associated with the wall/optical window and the alignment holes may be associated with the respective connector portions. Similarly, although FIG. 10 shows the over-molded portion associated with the connector portions fitting over the over-molded portion associated with the wall/optical window, these could be reversed. In addition, other types of couplings may be used to align the connector portions with the wall.

In conclusion, in one example, an interconnect system for coupling at least a first system operating in a first type of environment (e.g., a cryogenic environment) to at least a second system operating in a second type of environment (e.g., a non-cryogenic environment) is provided. The interconnect system may include at least a first connector coupled to at least a first set of optical fibers, where the at least the first set of the optical fibers is coupled to the at least the first system operating in the first type of environment. The interconnect system may further include at least a second connector coupled to at least a second set of optical fibers, where the at least the second set of the optical fibers is coupled to the at least the second system operating in the second type of environment. The interconnect system may further include: (1) at least a first port for coupling to the at least the first connector, and (2) at least a second port for coupling to the at least the second connector. The interconnect system may further include at least one interconnect, including at least a first distal end and at least a second distal end where the at least the first distal end of the at least one interconnect is coupled to the at least the first connector via the at least the first port, and where the at least the second distal end of the at least one interconnect is coupled to the at least the second connector via the at least the second port. The at least one interconnect may further be configured to carry signals between the at least the first set of the optical fibers and the at least the second set of the optical fibers, where the at least one interconnect is embedded in a vacuum chemical seal such that the first type of environment is substantially thermally isolated from the second type of environment.

In one example, the first system may be based on superconducting logic devices and the second system may be based on complimentary metal-oxide semiconductor (CMOS) logic devices. In one example, the cryogenic environment may correspond to a temperature in a range of 4 Kelvin to 77 Kelvin and the non-cryogenic environment may correspond to a temperature in a range of 200 Kelvin to 400 Kelvin. The vacuum chemical seal may be at least one of (1) at least one of magnesium silicate hydrate and epoxy resin, or (2) at least one of dichloromethane, trichloroethylene, xylene, and benzene. The vacuum chemical seal may be contained in at least one housing, and the at least one interconnect may be located inside the at least one housing.

In another example, an interconnect system for coupling at least a first system operating in a first type of environment (e.g., a cryogenic environment) to at least a second system operating in a second type of environment (e.g., a non-cryogenic environment) is provided. The interconnect system may include at least a first interface portion coupled to at least a first set of optical fibers, wherein the at least the first set of the optical fibers is coupled to the at least the first system operating in the first type of environment. The interconnect system may further include at least a second interface portion coupled to at least a second set of optical fibers, wherein the at least the second set of the optical fibers is coupled to the at least the second system operating in the second type of environment. The interconnect system may further include at least one feedthrough comprising: (1) at least one port for coupling the at least the first interface portion with the at least the second interface portion, and (2) at least one optical window, where the at least one optical window may include a plurality of lenses configured to couple optical signals between the at least the first set of the optical fibers and the at least the second set of the optical fibers, and where the at least one optical window may be configured to maintain a vacuum seal between the first type of environment and the second type of environment such that the first type of environment is substantially thermally isolated from the second type of environment.

In one example, the first system may be based on superconducting logic devices and the second system may be based on complimentary metal-oxide semiconductor (CMOS) logic devices. In one example, the cryogenic environment may correspond to a temperature in a range of 4 Kelvin to 77 Kelvin and the non-cryogenic environment may correspond to a temperature in a range of 200 Kelvin to 400 Kelvin. In one example, the lenses may be configured as an array of lenses. In addition, each of the at least the first set of the optical fibers may include a first lensed end and each of the at least the second set of the optical fibers may include a second lensed end, and each of the plurality of lenses may be positioned to process light rays traveling between the at least one of the first lensed and the second lensed end.

In yet another example, an interconnect system for coupling at least a first system operating in a first type of environment (e.g., a cryogenic environment) to at least a second system operating in a second type of environment (e.g., a non-cryogenic environment) is provided. The interconnect system may include at least a first connector coupled to at least a first set of optical fibers, where the at least the first set of the optical fibers is coupled to the at least the first system operating in the first type of environment. The interconnect system may further include at least a second connector coupled to at least a second set of optical fibers, where the at least the second set of the optical fibers is coupled to the at least the second system operating in the second type of environment. The interconnect system may further include at least a first port for coupling to the at least the first connector, and at least a second port for coupling to the at least the second connector. The interconnect system may further include at least one optical window configured to couple optical signals between the at least the first set of the optical fibers and the at least the second set of the optical fibers, and where the at least one optical window may be configured to maintain a vacuum seal between the first type of environment and the second type of environment such that the first type of environment is substantially thermally isolated from the second type of environment.

In one example, the first system may be based on superconducting logic devices and the second system may be based on complimentary metal-oxide semiconductor (CMOS) logic devices. In one example, the cryogenic environment may correspond to a temperature in a range of 4 Kelvin to 77 Kelvin and the non-cryogenic environment may correspond to a temperature in a range of 200 Kelvin to 400 Kelvin. In addition, each of the at least the first set of the optical fibers may include a first lensed end and each of the at least the second set of the optical fibers may include a second lensed end.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An interconnect system for coupling at least a first system operating in a cryogenic environment to at least a second system operating in a non-cryogenic environment, the interconnect system comprising:

at least a first interface portion coupled to at least a first set of optical fibers, wherein the at least the first set of the optical fibers is coupled to the at least the first system operating in the cryogenic environment, wherein the first interface portion comprises at least a first alignment hole;

at least a second interface portion coupled to at least a second set of optical fibers, wherein the at least the second set of the optical fibers is coupled to the at least the second system operating in the non-cryogenic environment, wherein the second interface portion comprises at least a second alignment hole; and at least one structure comprising: (1) at least one wall portion for separating the cryogenic environment from the non-cryogenic environment, and wherein the wall portion comprises at least a first alignment pin corresponding to the at least the first alignment hole associated with the first interface portion and at least a second alignment pin corresponding to the at last the second alignment hole associated with the second interface portion, and (2) at least one optical window, wherein the at least one optical window comprises a plurality of lenses configured to couple optical signals between the at least the first set of the optical fibers and the at least the second set of the optical fibers to permit bi-directional transfer of signals between the at least the first system operating in the cryogenic environment and the at least the second system operating in the non-cryogenic environment, and wherein the at least one optical window is configured to maintain a vacuum seal between the cryogenic environment and the non-cryogenic environment such that the cryogenic environment is substantially thermally isolated from the non-cryogenic environment.

2. The interconnect system of claim 1, wherein the at least the first system is based on superconducting logic devices.

3. The interconnect system of claim 1, wherein the at least second system is at least based on complimentary metal-oxide semiconductor (CMOS) logic devices.

4. The interconnect system of claim 1, wherein the cryogenic environment corresponds to a temperature in a range of 4 Kelvin to 77 Kelvin.

5. The interconnect system of claim 1, wherein the non-cryogenic environment corresponds to a temperature in a range of 200 Kelvin to 400 Kelvin.

6. The interconnect system of claim 1, wherein the plurality of lenses is configured as an array of lenses.

7. The interconnect system of claim 6, wherein each of the at least the first set of the optical fibers comprises a first lensed end and wherein each of the at least the second set of the optical fibers comprises a second lensed end, and wherein each of the plurality of lenses is positioned to process light rays traveling between the at least one of the first lensed and the second lensed end.

8. An interconnect system for coupling at least a first system operating in a cryogenic environment to at least a second system operating in a non-cryogenic environment, the interconnect system comprising:

at least a first connector coupled via a first connector boot to at least a first set of optical fibers, wherein the at least the first set of the optical fibers is coupled to the at least the first system operating in the cryogenic environment;

at least a second connector coupled via a second connector boot to at least a second set of optical fibers, wherein the at least the second set of the optical fibers is coupled to the at least the second system operating in the non-cryogenic environment;

at least a first port for coupling to the at least the first connector, and at least a second port for coupling to the at least the second connector, wherein each of the at least the first connector, the at least the second connector, the at least the first port, and the at least the second port is formed using a polymer;

a first optical sub-system comprising a first plurality of lenses and a second optical sub-system comprising a second plurality of lenses; and at least one optical window, wherein the first optical sub-system is arranged on a first side of the at least one optical window and the second optical sub-system is arranged on a second side of the at least one optical window, wherein the first side is opposite of the second side, and wherein each of the first optical sub-system and the second optical sub-system is configured to couple optical signals between the at least the first set of the optical fibers and the at least the second set of the optical fibers to permit bi-directional transfer of signals between the at least the first system operating in the cryogenic environment and the at least the second system operating in the non-cryogenic environment, and wherein the at least one optical window is configured to maintain a vacuum seal between the cryogenic environment and the non-cryogenic environment such that the cryogenic environment is substantially thermally isolated from the non-cryogenic environment.

9. The interconnect system of claim 8, wherein the at least the first system is based on superconducting logic devices.

10. The interconnect system of claim 8, wherein the at least second system is at least based on complimentary metal-oxide semiconductor (CMOS) logic devices.

11. The interconnect system of claim 8, wherein the cryogenic environment corresponds to a temperature in a range of 4 Kelvin to 77 Kelvin.

12. The interconnect system of claim 8, wherein the non-cryogenic environment corresponds to a temperature in a range of 200 Kelvin to 400 Kelvin.

13. The interconnect system of claim 8, wherein each of the at least the first set of the optical fibers comprises a first lensed end and wherein each of the at least the second set of the optical fibers comprises a second lensed end.

\* \* \* \* \*